(12) United States Patent
Liu et al.

(10) Patent No.: US 9,007,772 B2
(45) Date of Patent: Apr. 14, 2015

(54) ELECTRONIC DEVICE WITH HEAT DISSIPATION MODULE

(71) Applicants: Hong Fu Jin Precision Industry (ShenZhen) Co., Ltd., Shenzhen (CN); Hon Hai Precision Industry Co., Ltd., New Taipei (TW)

(72) Inventors: Lei Liu, Shenzhen (CN); Guo-Yi Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 291 days.

(21) Appl. No.: 13/730,681

(22) Filed: Dec. 28, 2012

(65) Prior Publication Data

US 2014/0168895 A1 Jun. 19, 2014

(30) Foreign Application Priority Data

Dec. 18, 2012 (CN) .......................... 2012 1 0549242

(51) Int. Cl.
*H05K 7/20* (2006.01)
*F28F 3/00* (2006.01)
*G06F 1/20* (2006.01)
*H01L 23/367* (2006.01)
*H01L 21/48* (2006.01)

(52) U.S. Cl.
CPC .............. *F28F 3/00* (2013.01); *H05K 7/20154* (2013.01); *G06F 1/20* (2013.01); *H01L 23/3672* (2013.01); *H01L 21/4882* (2013.01); *H01L 2924/0002* (2013.01)

(58) Field of Classification Search
USPC .......... 361/697, 702, 709, 710, 711; 165/80.3
See application file for complete search history.

(56) References Cited

U.S. PATENT DOCUMENTS

| | | | | |
|---|---|---|---|---|
| 5,014,776 | A | * | 5/1991 | Hess .............................. 165/185 |
| 5,509,465 | A | * | 4/1996 | Lai ............................... 165/80.3 |
| 5,558,155 | A | * | 9/1996 | Ito ................................ 165/80.3 |
| 5,570,271 | A | * | 10/1996 | Lavochkin .................... 361/704 |
| 5,763,950 | A | * | 6/1998 | Fujisaki et al. ............... 257/712 |
| 6,301,779 | B1 | * | 10/2001 | Azar .......................... 29/890.03 |
| 6,308,771 | B1 | * | 10/2001 | Tavassoli ..................... 165/80.3 |
| 6,321,451 | B1 | * | 11/2001 | Lee et al. ................... 29/890.03 |
| 6,349,762 | B2 | * | 2/2002 | Ohta ............................ 165/185 |
| 6,418,020 | B1 | * | 7/2002 | Lin ............................... 361/703 |
| 6,477,049 | B1 | * | 11/2002 | Lin ............................... 361/704 |
| 6,477,051 | B1 | * | 11/2002 | Barsun ......................... 361/704 |
| 6,637,502 | B1 | * | 10/2003 | North et al. .................. 165/80.3 |
| 6,675,885 | B2 | * | 1/2004 | Kuo ............................. 165/185 |
| 6,742,581 | B2 | * | 6/2004 | Mochizuki et al. ........... 165/185 |
| 7,050,302 | B2 | * | 5/2006 | Llapitan et al. ............... 361/704 |
| 7,136,286 | B2 | * | 11/2006 | Chuang ........................ 361/703 |
| 7,286,352 | B2 | * | 10/2007 | Curtis et al. .................. 361/697 |
| 8,555,952 | B2 | * | 10/2013 | Huang .......................... 165/80.3 |

(Continued)

*Primary Examiner* — Adrian S Wilson
(74) *Attorney, Agent, or Firm* — Novak Druce Connolly Bove + Quigg LLP

(57) ABSTRACT

An electronic device includes an enclosure, a circuit board arranged in the enclosure, a heat dissipation module set on the circuit board, and a fan arranged in the enclosure and aligned with the heat dissipation module. The heat dissipation module includes a base and a number of fins. A number of parallel receiving portions are formed on the base.

A slot is defined in each retaining portion. Each fin includes a main plate and a pivoting portion formed at a bottom the main plate. The pivoting portions are respectively and pivotably received in the slots of the base.

15 Claims, 7 Drawing Sheets

(56) References Cited

U.S. PATENT DOCUMENTS

| | | | |
|---|---|---|---|
| 8,807,204 B2* | 8/2014 | June et al. | 165/201 |
| 2005/0000682 A1* | 1/2005 | Chien et al. | 165/80.3 |
| 2006/0042783 A1* | 3/2006 | Hsu | 165/80.3 |
| 2006/0133038 A1* | 6/2006 | Yu et al. | 361/697 |
| 2007/0195502 A1* | 8/2007 | Yang et al. | 361/710 |
| 2008/0236790 A1* | 10/2008 | Bhatti et al. | 165/80.3 |
| 2009/0139691 A1* | 6/2009 | Wei | 165/80.3 |
| 2009/0147475 A1* | 6/2009 | Xu | 361/697 |
| 2009/0154108 A1* | 6/2009 | Guo et al. | 361/709 |
| 2009/0195990 A1* | 8/2009 | Honma | 361/710 |
| 2009/0211729 A1* | 8/2009 | Wang et al. | 165/80.3 |
| 2009/0268394 A1* | 10/2009 | Cheng | 361/679.54 |
| 2009/0310306 A1* | 12/2009 | Yu et al. | 361/697 |
| 2010/0124020 A1* | 5/2010 | Lin | 361/697 |
| 2011/0063800 A1* | 3/2011 | Park | 361/697 |
| 2011/0310563 A1* | 12/2011 | Meyer et al. | 361/704 |
| 2013/0120932 A1* | 5/2013 | Tan et al. | 361/679.54 |
| 2013/0138262 A1* | 5/2013 | Busch et al. | 700/300 |

* cited by examiner

ELECTRONIC DEVICE WITH HEAT DISSIPATION MODULE

BACKGROUND

1. Technical Field

The present disclosure relates to an electronic device with a heat dissipation module.

2. Description of Related Art

Many electronic devices include two or more central processing units (CPUs) arranged on a motherboard. A heat sink is attached to an upper surface of each CPU for heat dissipation. However, a first one of the heat sinks and the corresponding CPU, which are away from a fan, are shielded by the second one of the heat sinks and the corresponding CPU, which are adjacent to the fan. Therefore, heat dissipation of the first one of the heat sinks and the corresponding CPU is often inadequate.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean "at least one".

Figure 1:
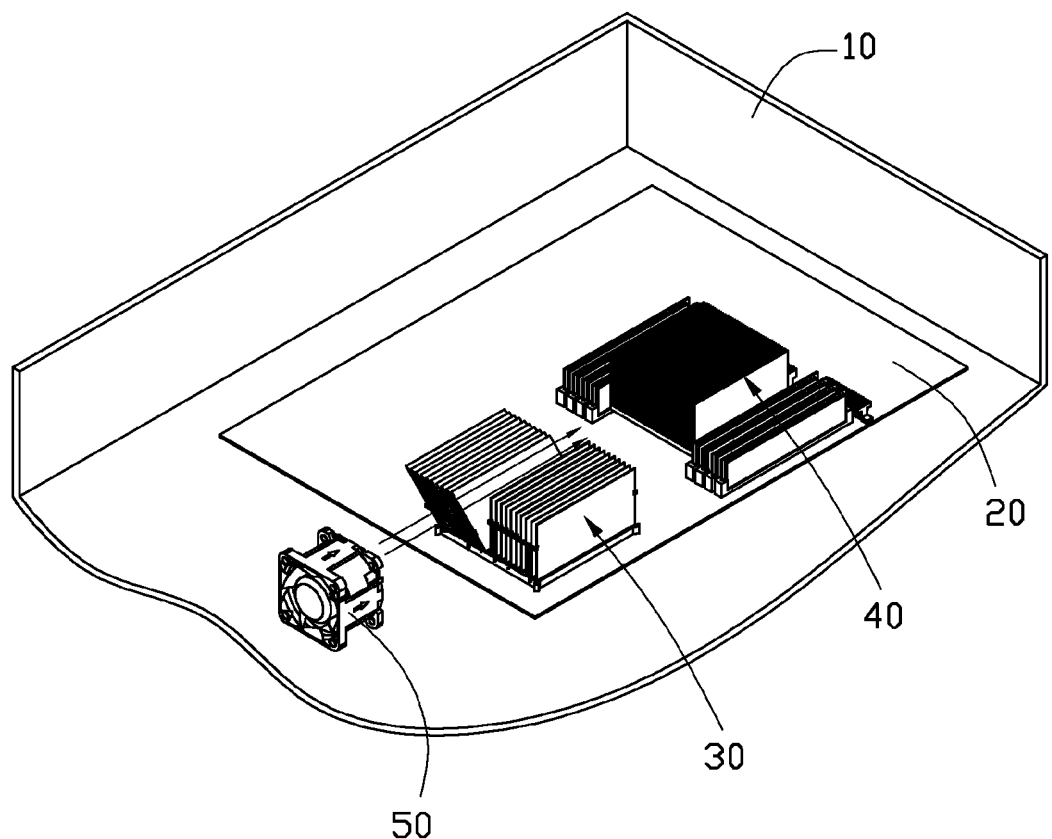
FIG. 1 is an isometric view of an embodiment of an electronic device, wherein the electronic device includes a heat dissipation module.

Referring to FIG. 1, an exemplary embodiment of an electronic device includes an enclosure 10, a circuit board 20 mounted in the enclosure 10, a heat dissipation module 30, a heat sink 40, and a fan 50. In this embodiment, the heat dissipation module 30 is used for dissipating heat produced by a first central processing unit (CPU) (not shown in pictures); the heat sink 40 is used for dissipating heat of a second CPU (not shown in pictures). The fan 50 is arranged in the enclosure 10 and aligned with the heat dissipation module 30. The heat dissipation module 30 is located between the fan 50 and the heat sink 40.

Figure 2:
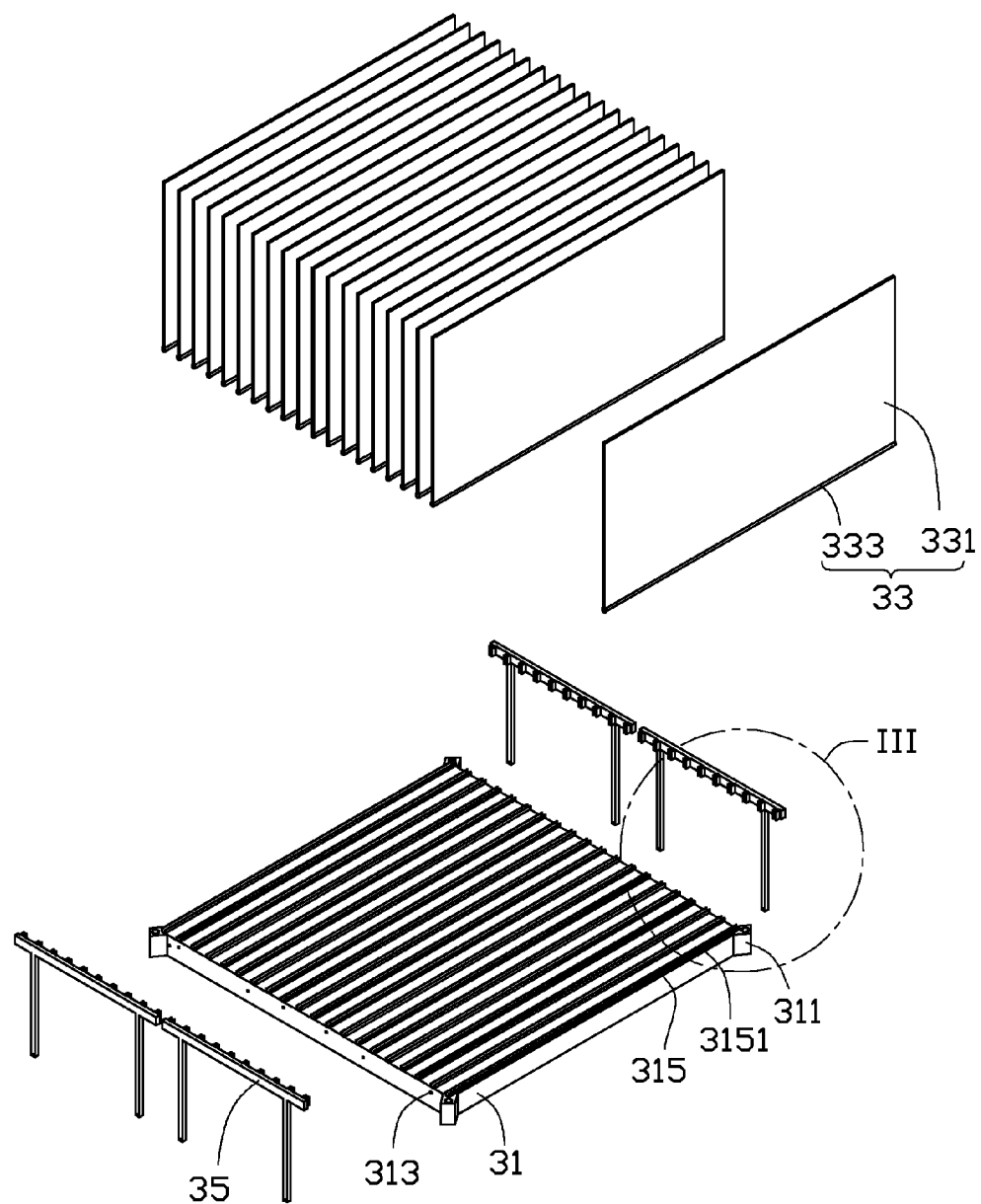
FIG. 2 is an exploded, isometric view of the heat dissipation module of FIG. 1.
Figure 3:
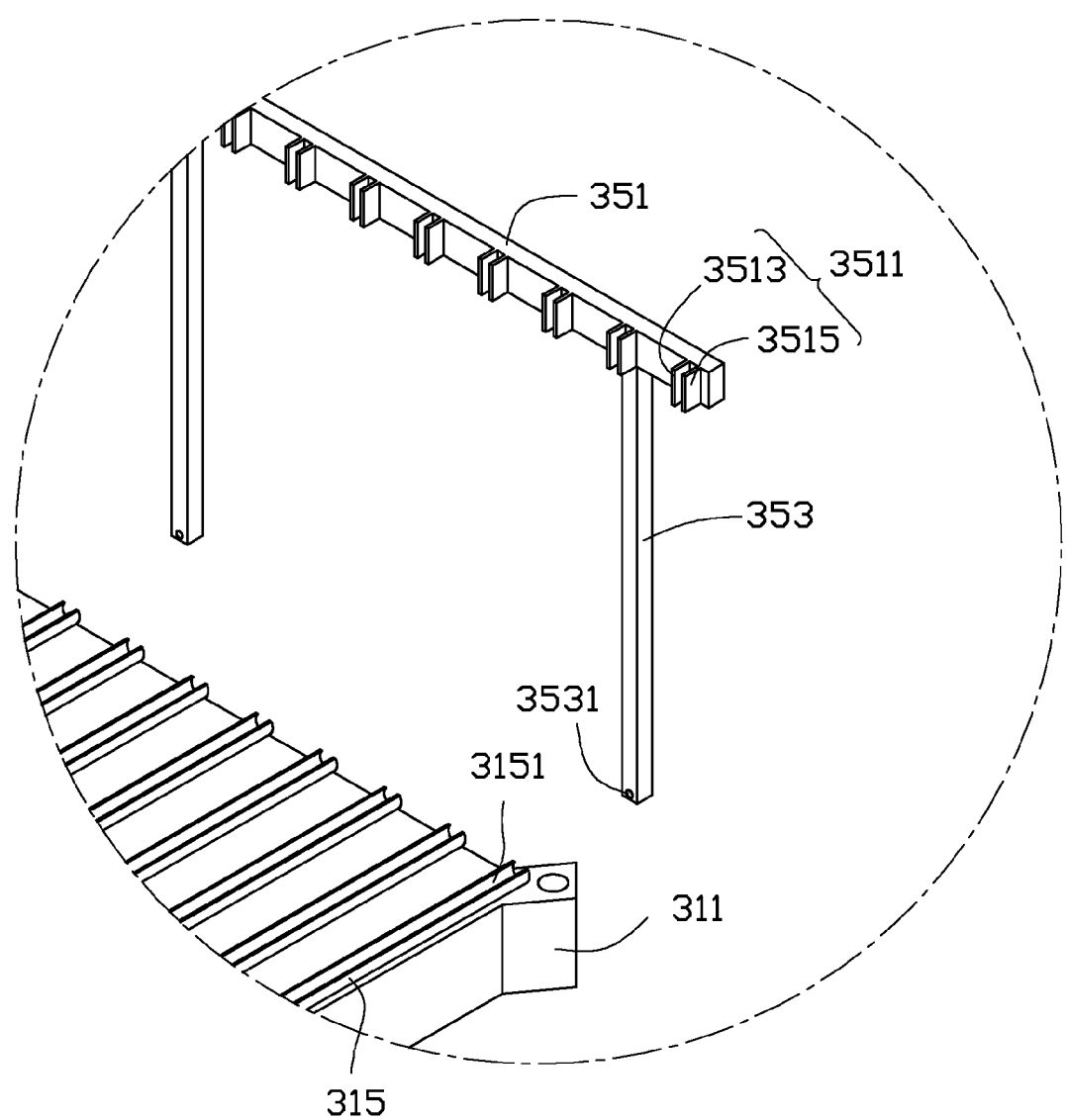
FIG. 3 is an enlarged view of a circled portion III of FIG. 2.
Figure 6:
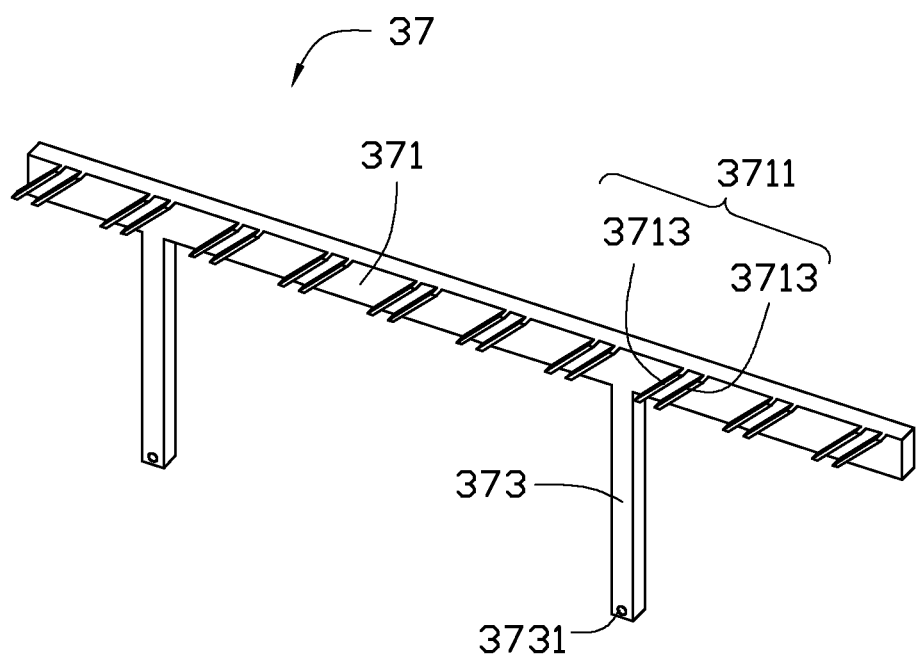
FIG. 6 is an enlarged view of a second retaining member of the heat dissipation module of FIG. 2.

Referring to FIG. 2 and FIG. 3, the heat dissipation module 30 includes a substantially rectangular base 31, a plurality of fins 33, a plurality of first retaining members 35, and a plurality of second retaining members 37 (as shown in FIG. 6). Four mounting blocks 311 are formed from four corners of the base 31, for mounting the base 31 on the circuit board 20. A plurality of mounting holes 313 is defined in opposite edges of the base 31, aligned with the fan 50 and the heat sink 40 respectively. A plurality of parallel elongated receiving portions 315 is formed on a top surface of the base 31. Each receiving portion 315 defines an elongated slot 3151 with a semicircular cross-section. Each fin 33 includes a main plate 331 and a pivoting portion 333 formed from a bottom side of the main plate 331 and having a semicircular cross-section.

Each first retaining member 35 includes a horizontal retaining pole 351 and two upright supporting poles 353 extending down from the retaining pole 351. A plurality of retaining portions 3511 is formed on an inner surface of the retaining pole 351. Each retaining portion 3511 includes two upright tabs 3513 and 3515. Each supporting pole 353 defines a mounting hole 3531 in a lower portion opposite to the retaining pole 351.

Referring to FIG. 6, each second retaining member 37 includes a horizontal retaining pole 371 and two upright supporting poles 373 extending down from the retaining pole 371. A plurality of retaining portions 3711 is formed on an inner surface of the retaining pole 371. Each retaining portion 3711 includes two sloped tabs 3713. Each supporting pole 373 defines a mounting hole 3731 in a lower portion opposite to the retaining pole 371.

Figure 4:
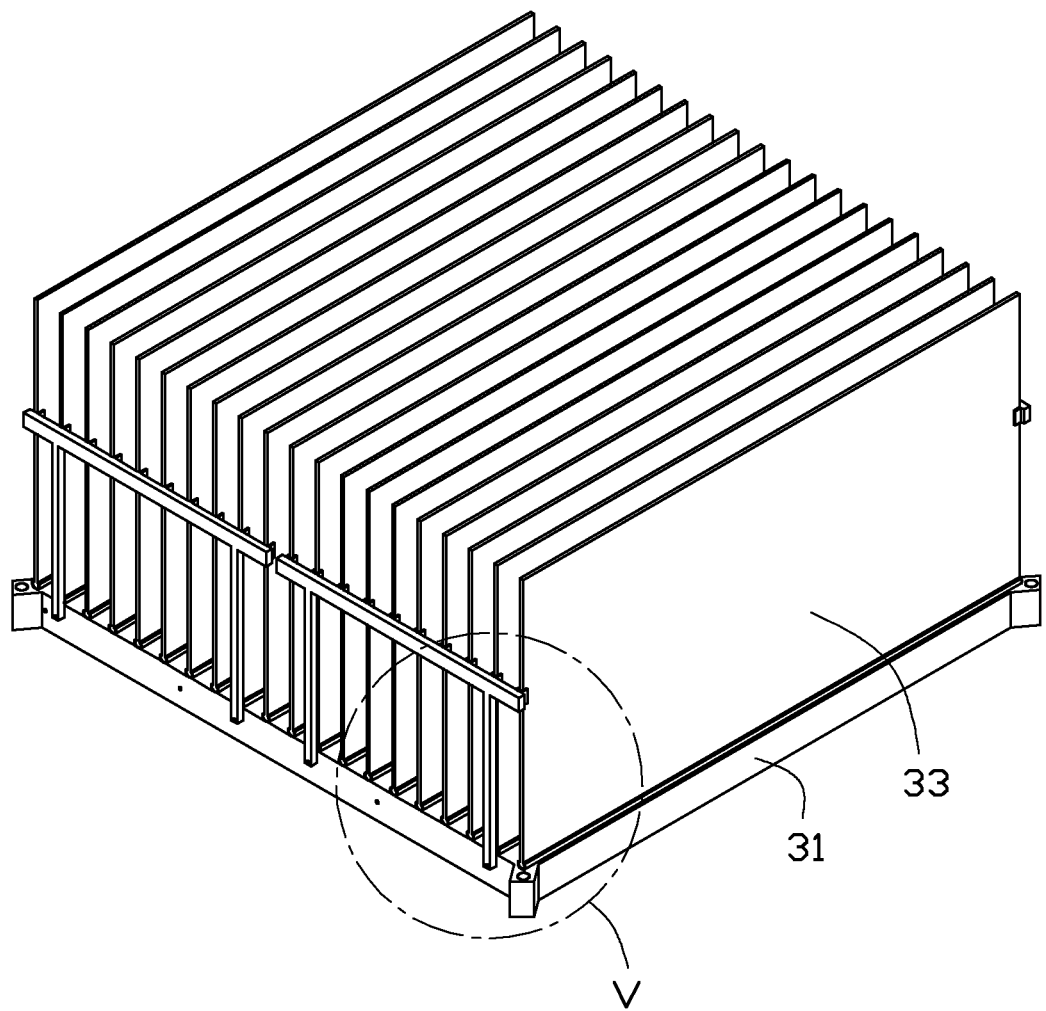
FIG. 4 is an assembled view of FIG. 2.
Figure 5:
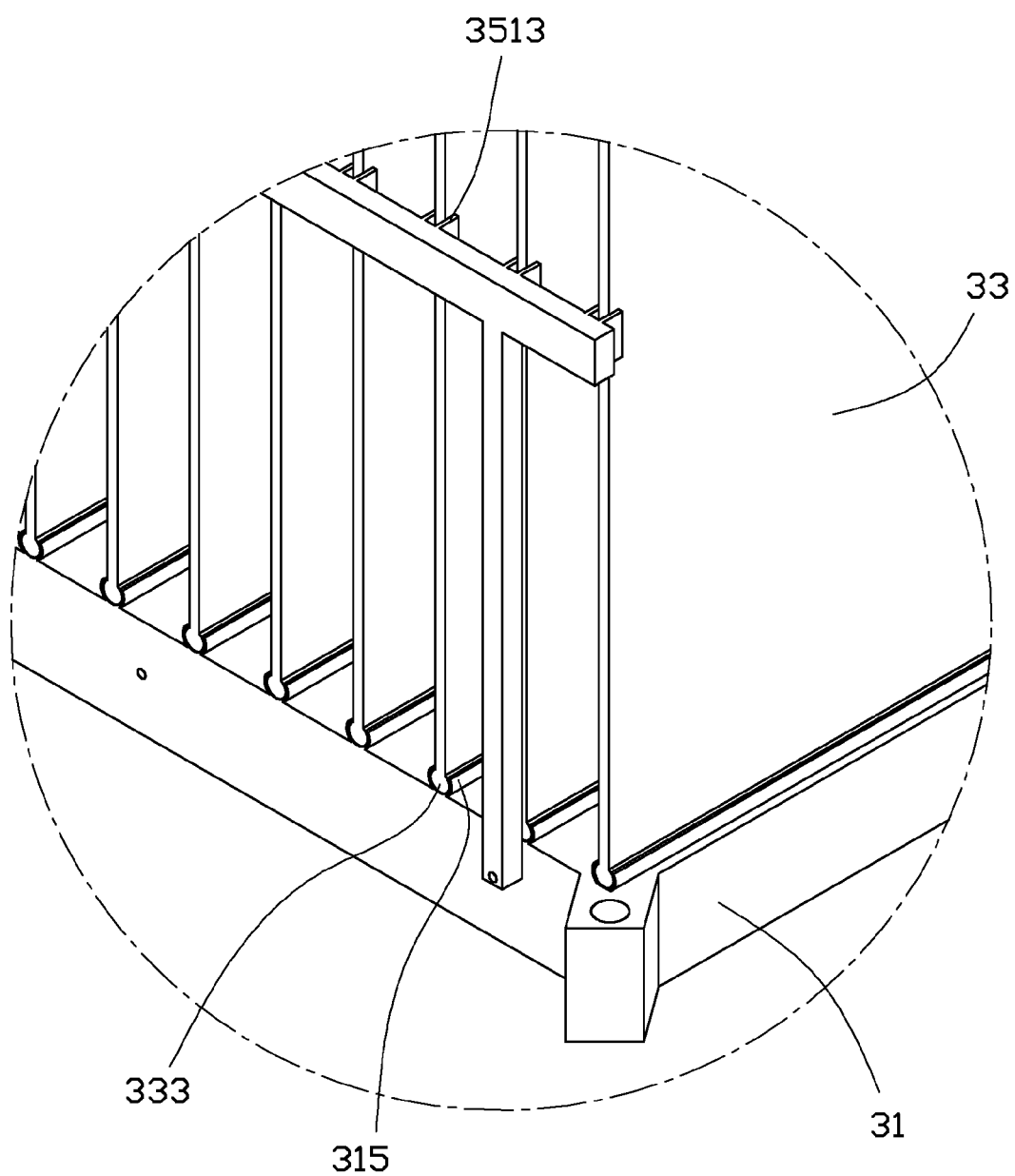
FIG. 5 is an enlarged view of a circled portion V of FIG. 4.

Referring to FIG. 4 and FIG. 5, the pivoting portions 333 are pivotably received in the corresponding slots 3151. The supporting poles 353 of the first retaining member 35 are fixed to the edges of the base 31 through the mounting holes 3531 and the mounting holes 313. Corresponding edges of the fins 33 are retained between the corresponding tabs 3513 and 3515. Thus, the fins 33 are uprightly mounted on the base 31.

Figure 7:
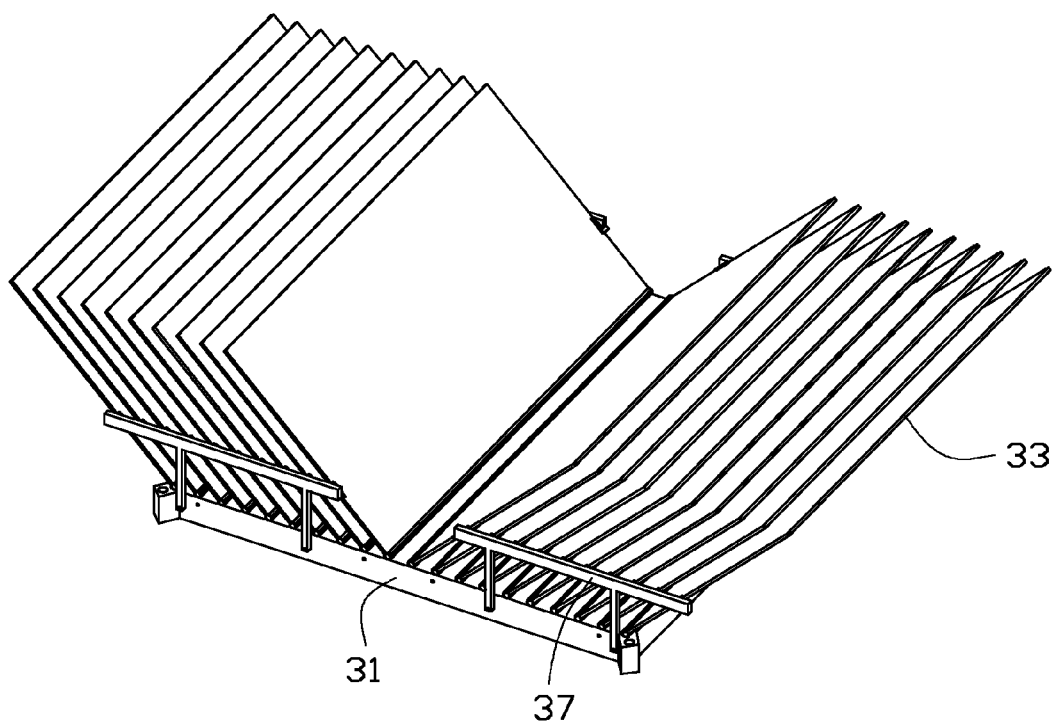
FIG. 7 is an assembled view of the heat dissipation module, but showing another using state.

FIG. 7 shows another using state of the heat dissipation module 30. The supporting poles 373 of the second retaining member 37 are fixed to the edges of the base 31 through the mounting holes 3731 and the mounting holes 313. Edges of the fins 33 are retained between the corresponding tabs 3713. The fins 33 are slantingly mounted on the base 31. Therefore, an airflow channel is formed between the fins 33. The airflow from the fan 50 can flow through the channel to flow to the heat sink 40, which is beneficial for dissipating from the heat sink 40.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A heat dissipation module, comprising:
   a base comprising a plurality of parallel elongated receiving portions, each of the receiving portions defines an elongated slot with a semicircular cross-section; and
   a plurality of fins each comprising a main plate and a pivoting portion with semicircular cross-section formed from a bottom side of the main plate, wherein the pivoting portions are respectively and pivotably received in the slots.

2. The heat dissipation module of claim 1, wherein a retaining member is fixed to one edge of the base, the retaining member comprises a retaining pole with a plurality of retaining portions retaining edges of the fins.

3. The heat dissipation module of claim 2, wherein each of the retaining portions comprises two parallel retaining tabs sandwiching the edge of a corresponding one of the fins.

4. The heat dissipation module of claim 3, wherein the retaining tabs are upright.

5. The heat dissipation module of claim 3, wherein the retaining tabs are sloped.

6. An electronic device, comprising:
an enclosure;
a circuit board arranged in the enclosure;
a heat dissipation module comprising a base mounted on the circuit board and a plurality of fins, wherein the base comprises a plurality of parallel elongated receiving portions, each of the receiving portions defines an elongated slot with a semicircular cross-section, each of the fins comprises a main plate and a pivoting portion with semicircular cross-section formed from a bottom of the main plate, wherein the pivoting portions are respectively and pivotably received in the slots; and
a fan arranged in the enclosure and aligned with the heat dissipation module.

7. The electronic device of claim 5, wherein a retaining member is fixed to one edge of the base, the retaining member comprises a retaining pole with a plurality of retaining portions retaining edges of the fins.

8. The electronic device of claim 7, wherein each of the retaining portions comprises two parallel retaining tabs sandwiching the edges of a corresponding one of the fins.

9. The electronic device of claim 8, wherein the retaining tabs are upright.

10. The electronic device of claim 8, wherein the retaining tabs are sloped.

11. The electronic device of claim 6, further comprising a heat sink set on the circuit board and located at a side of the heat dissipation module opposite to the fan, airflow from the fan flows through the heat dissipation module to flow to the heat sink.

12. An electronic device, comprising:
an enclosure;
a circuit board arranged in the enclosure;
a heat dissipation module comprising a base mounted on the circuit board and a plurality of fins, wherein the base comprises a plurality of parallel elongated receiving portions, each of the receiving portions defines an elongated slot with a semicircular cross-section, each of the fins comprises a main plate and a pivoting portion with semicircular cross-section formed from a bottom side of the main plate, wherein the pivoting portions are respectively and pivotably received in the slots;
a fan arranged in the enclosure and aligned with the heat dissipation module; and
a first retaining member and a second retaining member fixed to one edge of the base, wherein the first retaining member comprises a plurality of first retaining portions for retaining a part of the fins along a first direction relative to the base, the second retaining member comprising a plurality of second retaining portions for retaining another part of the fins along a second direction relative to the base different from the first direction.

13. The electronic device of claim 12, wherein each of the first retaining portions comprises two parallel and upright retaining tabs sandwiching the corresponding fin.

14. The electronic device of claim 8, wherein each of the second retaining portions comprises two parallel and sloped retaining tabs sandwiching the edge of a corresponding one of the fins.

15. The electronic device of claim 12, further comprising a heat sink set on the circuit board and located at a side of the heat dissipation module away from the fan, airflow from the fan flows through the heat dissipation module to flow to the heat sink.

* * * * *